(12) United States Patent
Oh

(10) Patent No.: US 10,594,965 B2
(45) Date of Patent: Mar. 17, 2020

(54) AVALANCHE PHOTODIODE IMAGE SENSORS

(71) Applicant: SEMICONDUCTOR COMPONENTS INDUSTRIES, LLC, Phoenix, AZ (US)

(72) Inventor: Minseok Oh, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 65 days.

(21) Appl. No.: 15/702,985

(22) Filed: Sep. 13, 2017

(65) Prior Publication Data

US 2019/0082128 A1 Mar. 14, 2019

(51) Int. Cl.
*H01L 31/107* (2006.01)
*H04N 5/361* (2011.01)
(Continued)

(52) U.S. Cl.
CPC ........... *H04N 5/361* (2013.01); *G01S 7/4865* (2013.01); *G01S 17/89* (2013.01); *H01L 27/1461* (2013.01); *H01L 27/14627* (2013.01); *H01L 27/14636* (2013.01); *H01L 27/14643* (2013.01); *H01L 31/107* (2013.01); *H01L 31/153* (2013.01); *H04N 5/378* (2013.01); *H04N 13/204* (2018.05)

(58) Field of Classification Search
CPC ............ H01L 31/107; G01J 2001/4466; G01J 2001/442
See application file for complete search history.

(56) References Cited

U.S. PATENT DOCUMENTS 6,934,029 B1\* 8/2005 Matzan .............. G01N 21/8901
356/430
2006/0192086 A1 8/2006 Niclass et al.
(Continued)

FOREIGN PATENT DOCUMENTS

EP 2541219 A1 1/2013

OTHER PUBLICATIONS

Kong, et al., "Smart three-dimensional imaging ladar using two Geiger-mode avalanche photodiodes," Optics Express, Sep. 26, 2011, vol. 19, No. 20, The Optical Society of America.
(Continued)

*Primary Examiner* — Thanh Luu
(74) *Attorney, Agent, or Firm* — Treyz Law Group, P.C.; Michael H. Lyons; Matthew R. Williams

(57) ABSTRACT

An electronic device may include an array of pixels. Each pixel may include a first single photon avalanche photodiode circuit that generates a first output signal on a first conductive line, a second avalanche photodiode circuit that generates a second output signal on a second conductive line, and a logic NAND gate having a first input coupled to the first conductive line, a second input coupled to the second conductive line, and an output coupled to an output line. The logic NAND gate may generate a third output signal based on the first and second output signals that is independent of dark current generated by the avalanche photodiodes. The third output signal may be processed to generate range values that are further processed to generate three-dimensional images of a scene.

18 Claims, 6 Drawing Sheets

(51) Int. Cl.
*H01L 27/146* (2006.01)
*H04N 5/378* (2011.01)
*H01L 31/153* (2006.01)
*H04N 13/204* (2018.01)
*G01S 7/4865* (2020.01)
*G01S 17/89* (2020.01)

(56) References Cited

U.S. PATENT DOCUMENTS

| | | | |
|---|---|---|---|
| 2007/0182949 | A1* | 8/2007 | Niclass ............... G01C 3/08 356/3 |
| 2009/0095887 | A1 | 4/2009 | Saveliev |
| 2011/0017918 | A1* | 1/2011 | Baeumer ............... G01T 1/17 250/370.11 |
| 2013/0021342 | A1 | 1/2013 | Goodman |
| 2015/0338270 | A1 | 11/2015 | Williams et al. |
| 2017/0155225 | A1 | 6/2017 | Villeneuve et al. |
| 2017/0357061 | A1* | 12/2017 | Shields ............... G01J 1/0425 |

OTHER PUBLICATIONS

Thomas Frach, The Digital Silicon Photomultiplier—Princliple of Operation and Intrinsic Detector Performance, 2009 IEEE Nuclear Science Symposium Conference Record, Nov. 13, 2009, pp. 1959-1969, IEEE.

* cited by examiner

AVALANCHE PHOTODIODE IMAGE SENSORS

BACKGROUND

This relates generally to image sensors and, more particularly, to image sensors with avalanche photodiodes.

Image sensors are commonly used in electronic devices such as cellular telephones, cameras, and computers to capture images. In a typical arrangement, an electronic device is provided with an array of image pixels arranged in pixel rows and pixel columns. Each pixel includes a photodiode that receives incident photons (light) and converts the photons into electrical signals. In some scenarios, the photodiode is an avalanche photodiode capable of converting relatively small numbers of photons into a measureable charge. However, avalanche photodiodes are particularly susceptible to thermal effects which can generate dark current and noise in the corresponding image.

It would therefore be desirable to be able to provide improved image sensors with avalanche photodiodes.

BRIEF DESCRIPTION OF THE DRAWINGS

FIG. 4 is a layout diagram of illustrative pixel circuitry of the type shown in

FIG. 3 in accordance with an embodiment.

DETAILED DESCRIPTION

Figure 1:
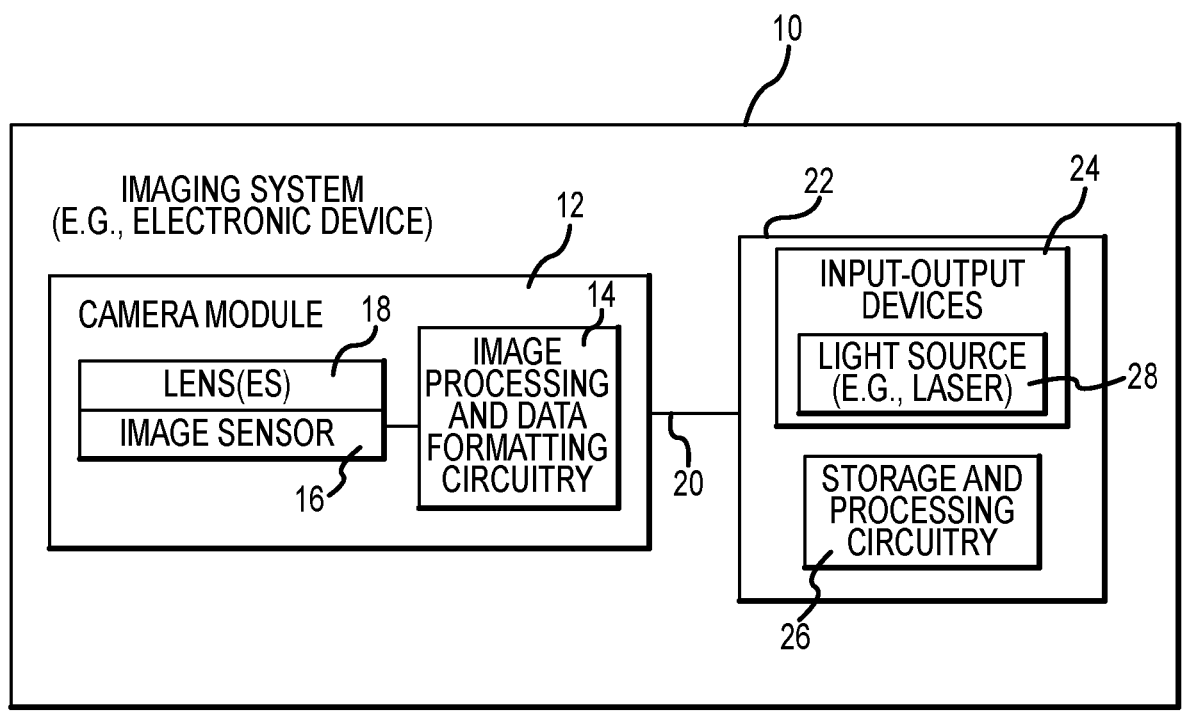
FIG. 1 is a schematic diagram of an illustrative imaging system that may include an image sensor with avalanche photodiodes in accordance with an embodiment.

Embodiments of the present invention relate to imaging systems having image sensors with pixels that include multiple avalanche photodiodes and dark count rate mitigation capabilities. An imaging system such as an electronic device with a digital camera module is shown in FIG. 1. As shown in FIG. 1, imaging system 10 may be an electronic device such as a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). The pixels may be arranged in an array having rows and columns.

An image sensor may include any desired additional circuitry. As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Image sensor 16 may generate image data in response to light received from a scene. The image data may include range data indicative of the distance between image sensor 16 and imaged objects in the scene. The range data may, for example, be used to generate three-dimensional images (e.g., light detection and ranging or LIDAR images) of the imaged scene.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked. If desired, image processing and data formatting circuitry 14 may process image data from image sensor 16 to generate three-dimensional images of the imaged scene.

Camera module 12 may convey acquired image data to host subsystems 22 over path 20 (e.g., image processing and data formatting circuitry 14 may convey image data to subsystems 22). Imaging system 10 typically provides a user with numerous high-level functions. In a computer or advanced cellular telephone, for example, a user may be provided with the ability to run user applications. To implement these functions, host subsystem 22 of imaging system 10 may include storage and processing circuitry 26 and input-output devices 24 such as keypads, input-output ports, joysticks, and displays. Storage and processing circuitry 26 may include volatile and nonvolatile memory (e.g., random-access memory, flash memory, hard drives, solid state drives, etc.). Storage and processing circuitry 26 may also include microprocessors, microcontrollers, digital signal processors, application specific integrated circuits, or other processing circuits.

Input-output devices 24 may include light emitters such as one or more light sources 28. Light source 28 may emit light to illuminate some or all of a scene to be imaged. In one suitable arrangement, light source 28 may include one or more lasers that emit laser light. Light source 28 may emit visible light, infrared light, and/or ultraviolet light if desired. Light source 28 may sweep the light over different directions to illuminate only some of the scene (e.g., particular locations in the scene) at a given time. This is merely illustrative and, in general, any desired light source may be used.

Image sensor 16 may generate image signals in response to light generated by light source 28 that has been reflected off of objects in the imaged scene. In the example where source 28 includes a laser, light source 28 may emit light in a particular predetermined direction. Image sensor 16 may gather image signals in response to the light emitted by source 28 and reflected off of objects in that particular direction. Light source 28 may sweep over all possible directions in the scene to be imaged while image sensor 16 continues to generate image signals in response to the reflected light. In this way, image sensor 16 may generate image signals in response to reflected light off of objects across the entire scene to be imaged. The image signals may be processed to generate a three dimensional image (e.g., a LIDAR image) that includes information about the distance between image sensor 16 and objects in the imaged scene and/or to identify and track objects or targets in the scene (e.g., in the three dimensional image).

Figure 2:
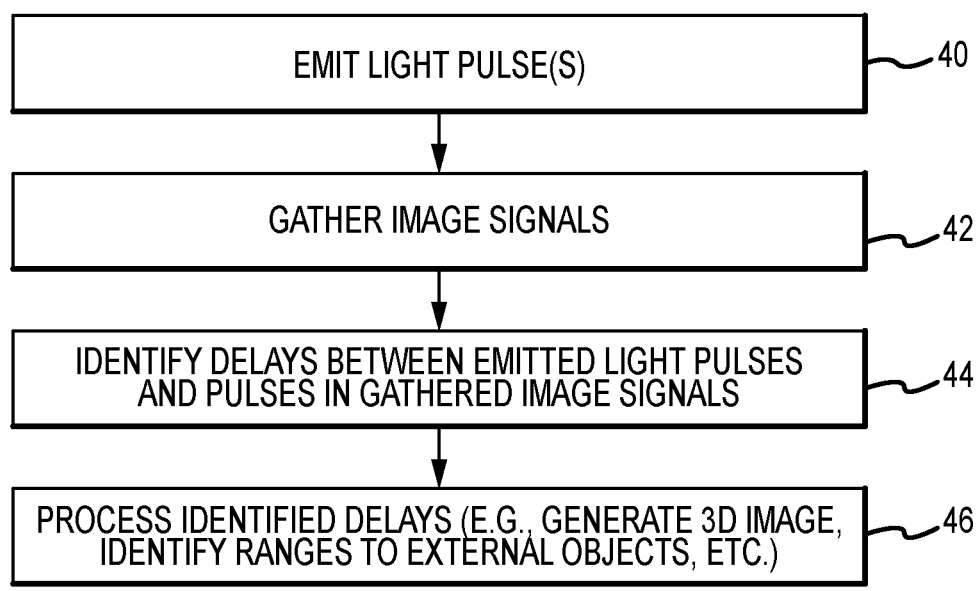
FIG. 2 is a flow chart of illustrative steps that may be performed by an imaging system of the type shown in FIG. 1 in generating and processing image signals in accordance with an embodiment.

FIG. 2 is a flow chart of illustrative steps that may be performed by imaging system 10 in generating and processing image data (e.g., three dimensional images of a scene). As shown in FIG. 2, at step 40, light source 28 may emit light (e.g., laser light). For example, light source 28 may emit light across all possible directions in the scene to be imaged. Light source 28 may emit the light in one or more pulses at each direction (e.g., light source 28 may scan or sweep the pulses over all possible directions in the imaged scene). Storage and processing circuitry 26 may identify and track the times at which each light pulse is transmitted in each direction.

At each direction for the emitted light, pixel circuitry in image sensor 16 may generate image signals in response to the emitted light reflected back towards image sensor 16 from the imaged scene (step 42). The image signals may, for example, include signal pulses corresponding to the pulses of light emitted by light source 28. The image signals may be passed to processing circuitry 14 and/or 26 (FIG. 1). Image processing circuitry 14 and/or 26 may identify and track the times at which each pulse is received in the image signals generated by image sensor 16 (e.g., for each direction of the emitted light).

At step 44, processing circuitry 14 and/or 26 may identify time differences (i.e., delays) between the emitted pulses of light and the pulses in the image signals generated by image sensor 16. For example, the processing circuitry may identify delays between the emitted light pulses and the generated image signal pulses at each direction in the imaged scene. In this way, the processing circuitry may identify delays between the emitted and received light across the entire imaged scene.

At step 46, processing circuitry 14 and/or 26 may process the identified delays across the imaged scene. For example, a time-to-digital converter (TDC) or other circuitry in processing circuitry 14 and/or 26 may identify a time-of-flight for the emitted light between transmission by emitter 28 and reception by sensor 16. The time-of-flight may be used to identify the distance (range) between image sensor 16 and objects in the imaged scene across all possible directions in the imaged scene based on the identified delays (e.g., the ranges may be determined given the known speed of emitted and received light and the identified time-of-flight). In one suitable arrangement, many determined time-of-flight values (e.g., thousands) may be measured for each direction and represented by a histogram. The identified time-of-flight values and/or ranges across all possible directions in the imaged scene may form a three-dimensional image of the scene (e.g., a LIDAR image), for example. The three dimensional image may be further processed, saved in memory, and/or provided to a user of imaging system 10 if desired. In one suitable arrangement, the processing circuitry may identify and track objects or targets in the three-dimensional images gathered by device 10 over time.

Image sensor 16 may include an array of pixels arranged in rows and columns for generating the image signal pulses in response to the reflected light. Each pixel may include photodiodes such as avalanche photodiodes. Avalanche photodiodes may, for example, be subject to a reverse bias voltage and may generate an avalanche of charge in response to an impact from a received photon. The avalanche of charge may, for example, serve as an inherent gain that greatly amplifies the signal generated by a single photon to a level that is more easily measurable. In this way, the avalanche photodiodes may be able to generate measureable charge in response to relatively few received photons.

In practice, avalanche photodiodes are typically subject to thermal noise. In particular, thermal effects may also erroneously generate an avalanche of charge that is manifested as a dark current signal pulse that is not generated in response to a received photon. Such pulses may be measured by readout circuitry in sensor 16 and may be recorded as a so-called dark count. The rate of dark counts that are measured over time may sometimes be referred to as dark count rate. For many image processing operations such as three-dimensional image generation and/or object tracking, an excessively high dark count rate may generate noise or errors in the three-dimensional image and/or make it difficult to track objects in the imaged scene.

In some scenarios, the dark count rate may be limited by cooling image sensor 16 to limit thermal effects. However, in practice, it can be overly expensive and consume an excessive amount of real estate within sensor 16 to sufficiently cool image sensor 16 to mitigate such thermal effects. In other scenarios, image processing operations may be performed by processing circuitry 26 to identify and filter dark counts. However, such image processing scenarios may consume an excessive amount of time and processing power, which can be too costly in scenarios where real-time data is required. For example, it may be difficult or impossible to perform precise target recognition and tracking in the imaged scene if image processing techniques are performed to compensate for an excessively high dark count rate. If desired, the pixel circuitry in image sensor 16 may be provided with built-in structures for minimizing dark count rate.

Figure 3:
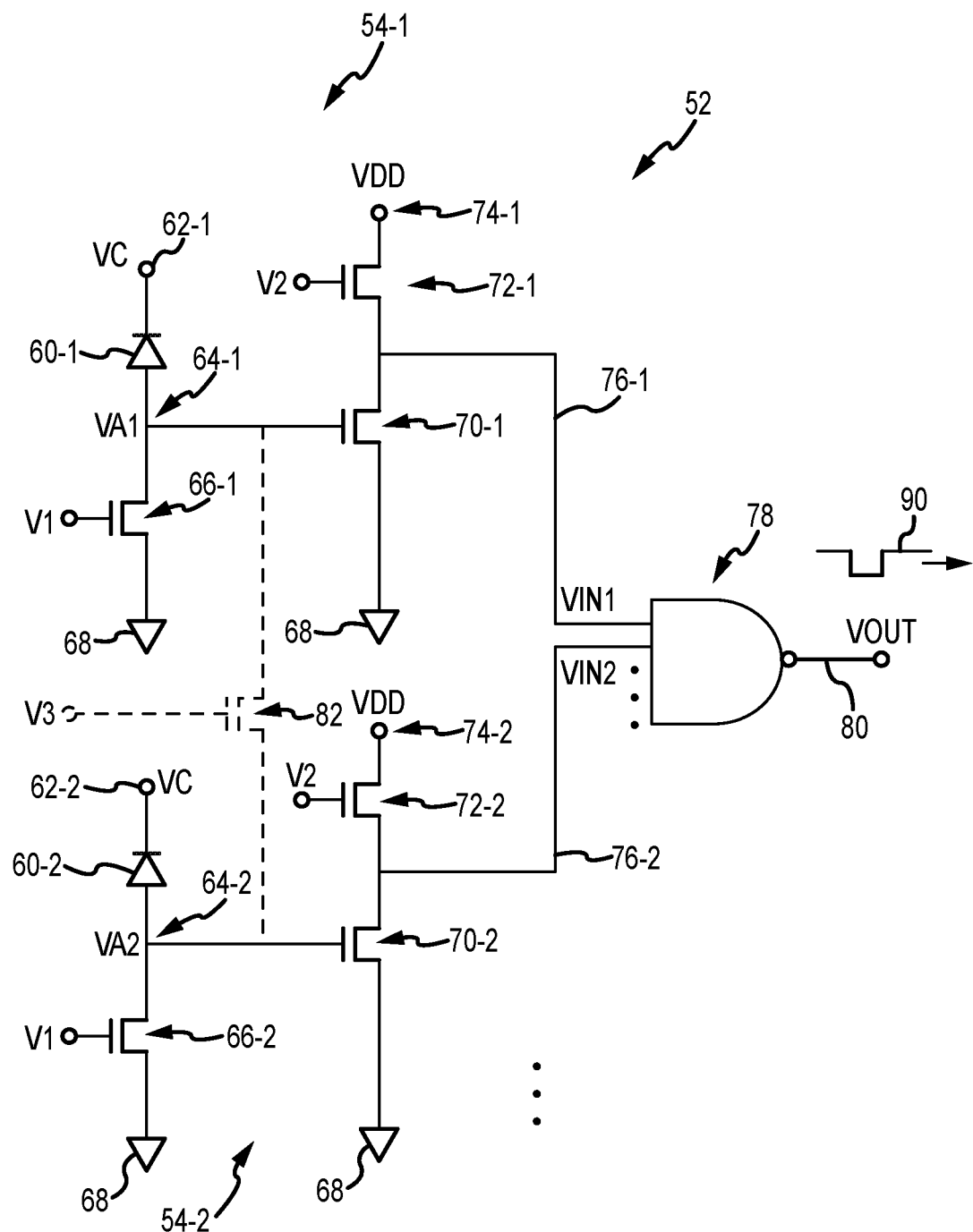
FIG. 3 is a circuit diagram of illustrative pixel circuitry having multiple avalanche photodiodes and dark count rate mitigation capabilities in accordance with an embodiment.

FIG. 3 is a circuit diagram showing how pixel circuitry in image sensor 16 may include structures for minimizing dark count rate. As shown in FIG. 3, image sensor 16 may include an array of pixels 52. While FIG. 3 only shows a single pixel 52, multiple pixels 52 may be arranged in rows and columns of a corresponding array. The pixels in the array may be formed on the same semiconductor substrate such as the same integrated circuit.

Pixel 52 may include multiple avalanche photodiode circuits 54 such as a first avalanche photodiode circuit 54-1 and a second avalanche photodiode circuit 54-2. Circuit 54-1 may include a first avalanche photodiode 60-1 whereas circuit 54-2 includes a second avalanche photodiode 60-2. When arranged in this way, the avalanche photodiodes in the array of pixels 52 may also be arranged in an array of rows and columns of avalanche photodiodes. Pixel circuitry 52 may receive control inputs VC, VDD, V1, V2, and a reference (ground) voltage from control circuitry in image sensor 16.

Avalanche photodiode 60-1 may be subjected to a reverse bias. For example, the cathode of avalanche photodiode 60-1 may be coupled to terminal 62-1 that is biased using cathode voltage (potential) VC. The anode of avalanche photodiode 60-1 may be coupled to node 64-1 held at anode voltage (potential) VA1. Node 64-1 may be coupled to ground terminal 68 (i.e., a terminal held at a ground voltage or other reference voltage) through photodiode tuning transistor 66-1. The gate of photodiode tuning transistor 66-1 may receive control signal V1. Control circuitry in image sensor 16 may adjust control signal V1 to adjust anode voltage VA1 to thereby tune the reverse bias across avalanche photodiode 60-1.

Node 64-1 may be coupled to output line 76-1 through source follower 70-1 (i.e., the gate terminal of source follower 70-1 may be coupled to node 64-1, a first source-drain terminal of source-follower 70-1 may be coupled to ground 68, and a second source-drain terminal of source-follower 70-1 may be coupled to node 76-1). Output transistor 72-1 may be coupled between supply voltage input 74-1 and node 76-1 (sometimes referred to herein as output line 76-1 or conductive line 76-1). Supply voltage VDD may be provided at terminal 74-1. Control circuitry in image sensor 16 may adjust control signal V2 provided to the gate of transistor 72-1 to adjust the current provided on output line 76-1 if desired. When image light is received at photodiode 60-1 or when thermal effects generate a dark current at photodiode 60-1, charge may be conveyed from photodiode 60-1 to output line 76-1 and a corresponding pulse may be generated in output signal VIN1 provided on output line 76-1 (e.g., a pulse from a logic low level to a logic high level).

Avalanche photodiode 60-2 may be subjected to a reverse bias. For example, the cathode of avalanche photodiode 60-2 may be coupled to terminal 62-2 that is biased using cathode voltage (potential) VC. The anode of avalanche photodiode 60-2 may be coupled to node 64-2 held at anode voltage (potential) VA2. Node 64-2 may be coupled to ground terminal 68 (i.e., a terminal held at a ground voltage or other reference voltage) through photodiode tuning transistor 66-2. The gate of photodiode tuning transistor 66-2 may receive control signal V1. Control circuitry in image sensor 16 may adjust control signal V1 to adjust anode voltage VA2 to thereby tune the reverse bias across avalanche photodiode 60-2.

Node 64-2 may be coupled to output line 76-2 through source follower 70-2 (i.e., the gate terminal of source follower 70-2 may be coupled to node 64-2, a first source-drain terminal of source-follower 70-2 may be coupled to ground 68, and a second source-drain terminal of source-follower 70-2 may be coupled to node 76-2). Output transistor 72-2 may be coupled between supply voltage input 74-2 and node 76-2 (sometimes referred to herein as output line 76-2 or conductive line 76-2). Supply voltage VDD may be provided at terminal 74-2. Control circuitry in image sensor 16 may adjust control signal V2 provided to the gate of transistor 72-2 to adjust the current provided on output line 76-2 if desired. When image light is received at photodiode 60-2 or when thermal effects generate a dark current at photodiode 60-2, charge may be conveyed from photodiode 60-2 to output line 76-2 and a corresponding pulse may be generated in output signal VIN2 provided on output line 76-2 (e.g., a pulse from a logic low level to a logic high level).

Whenever photodiode 60-1 receives a pulse of image light (e.g., a light pulse emitted by light source 28 of FIG. 1 and reflected off of the scene), there is a relatively high probability that both photodiodes 60-1 and 60-2 will receive that light pulse. In contrast, thermal effects on photodiodes 60-1 and 60-2 are stochastic and there is a relatively low probability that a thermally-generated dark current at circuit 54-1 will occur at the same time as a thermally-generated dark current at circuit 54-2. In order to distinguish between dark current events and true pulses in response to detected image light, the output lines 76 of avalanche photodiode circuits 54 may be coupled to the inputs of a logic gate such as logic NAND gate 78. For example, line 76-1 may be coupled to a first input of logic NAND gate 78 whereas line 76-2 is coupled to a second input of logic NAND gate 78.

Logic NAND gate 78 may perform a logic NAND operation on inputs VIN1 and VIN2 to produce a corresponding output signal VOUT. For example, logic NAND gate 78 will output signal VOUT at a logic high level whenever one or both of input signals VIN1 and VIN2 is at a logic low level and will output signal VOUT at a logic low level whenever both inputs VIN1 and VIN2 are at a logic high level. When only one of signals VIN1 and VIN2 are provided at a logic high level, this may be indicative of a dark current false signal instead of a true image signal in response to a received pulse of light (e.g., because true image signals are generated simultaneously in both photodiodes 60-1 and 60-2), and the output of logic NAND gate 78 may remain at a logic high level. However, when both of signals VIN1 and VIN2 are provided at the logic high level, this may be indicative of a true image signal in response to a received pulse of light and the output of logic NAND gate 78 may be pulsed at a logic low level (as shown by waveform 90). This pulse may be output to processing circuitry 14 and/or 26 (e.g., a time-to-digital converter). The processing circuitry may compare the timing of pulse 90 to the timing of the corresponding light pulse emitted by light source 28 to identify a time-of-flight for the corresponding light and a range to a corresponding object in the imaged scene. In this way, pulse 90 may, for example, be independent of any dark current on photodiodes 60-1 and 60-2.

In this way, false events corresponding to thermal dark current effects in avalanche photodiodes 60 may be filtered out from signal VOUT prior to processing by circuitry 14 and/or 26 (e.g., without needing to cool pixel 52). Dark counts corresponding to the thermal dark effects may thereby be eliminated, thereby minimizing the dark count rate of image sensor 16 and any corresponding noise in the resultant three-dimensional image. This may, for example, allow the processing circuitry to generate three-dimensional images that are free from noise and to perform object recognition and tracking using the three-dimensional images.

If desired, an optional transistor 82 may be coupled between node 64-1 in circuit 54-1 and node 64-2 in circuit 54-2. The gate of transistor 82 may be controlled using control signal V3. Control circuitry in sensor 16 may control gate 82 using signal V3 to selectively couple or decouple nodes 64-1 and 64-2. When transistor 82 is turned on, nodes 64-1 and 64-2 are coupled together and photodiodes 64-1 and 64-2 may effectively (electrically) form a single larger photodiode (e.g., having greater quantum efficiency than a single one of the photodiodes). However, at the same time, dark count rate suppression may not be performed when gate 82 is turned on. When transistor 82 is turned off, nodes 64-1 and 64-2 are decoupled and dark count rate suppression may be performed. As an example, the control circuitry in sensor 16 may turn transistor 82 on when relatively high quantum efficiency is desired and may turn transistor 82 off when dark count rate suppression is desired.

The example of FIG. 3 is merely illustrative. If desired, more than two avalanche photodiode circuits 54 may be coupled to the input of NAND gate 78 (e.g., output VOUT of gate 78 will only pulse low in response to each of the inputs to NAND gate 78 pulsing high, corresponding to a true image light signal). In one suitable arrangement, pixel 52 may include four photodiode circuits 54 arranged in a pattern of two columns and two rows (e.g., a two by two pattern), arranged in a pattern of one column or one row, or arranged in any other desired pattern. Other numbers of photodiode circuits 54 may be used (e.g., three photodiode circuits, five photodiode circuits, six photodiode circuits, more than six photodiode circuits, etc.). Circuits 54-1 and 54-2 may be arranged in a single row instead of a single column if desired.

If desired, other logic circuitry may be used in place of or in addition to logic NAND gate 78. In one suitable arrangement, majority vote logic circuitry may be coupled between lines 76 and output 80. In this scenario, the majority vote logic circuitry may generate pulse 90 in output signal VOUT when a majority of the signals on input lines 76 pulse high (i.e., all of the signals input to the logic circuitry need not pulse high for a pulse to be generated on output VOUT for identifying time-of-flight). Photodiodes 60 may be Geiger-mode avalanche photodiodes (sometimes referred to as single photon avalanche photodiodes (SPADs)) or other desired types of avalanche photodiodes (e.g., linear mode avalanche photodiodes) if desired.

Figure 4:
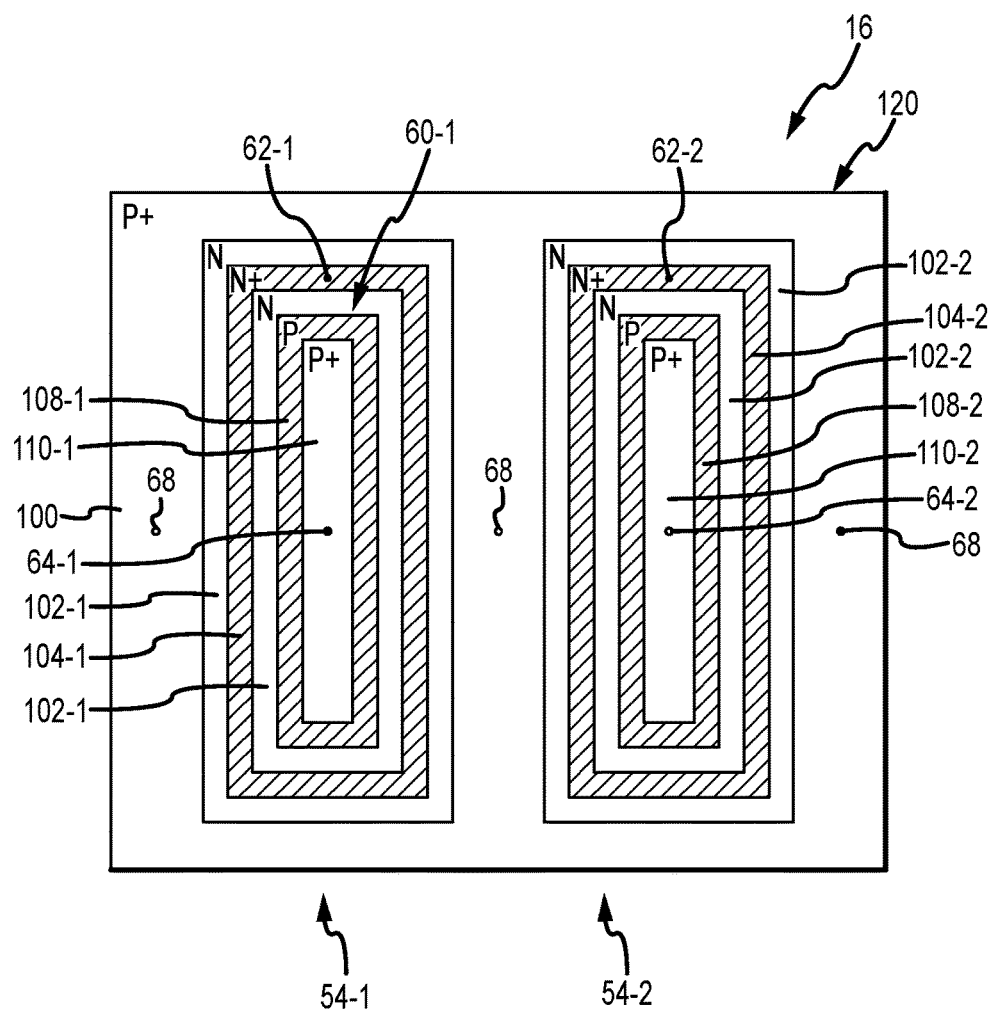

FIG. 4 is a top-down layout diagram of pixel circuitry 52 of FIG. 3. As shown in FIG. 4, pixel circuitry 52 may be formed on a semiconductor substrate 120 (e.g., an integrated circuit). Other pixels 52 in a pixel array may also be formed on substrate 120 if desired (e.g., substrate 120 may sometimes be referred to herein as pixel array 120 and may itself include an array of pixels 52 and avalanche photodiode circuits 54 having corresponding avalanche photodiodes 60).

Avalanche photodiode circuit 54-1 may include a well of N-type doped semiconductor 102-1 in substrate 120. N-type well 102-1 may be surrounded by P+ type doped region 100 at the surface of substrate 120. P+ type doped region 100 may be coupled to one or more ground inputs 68 held at a ground or reference potential. N+ type doped region 104-1 and P-type doped region 108-1 may be formed within N-type well 102-1. N+ type doped region 104-2 may be coupled to one or more control inputs 62-1 held at voltage VC. P+ type doped region 110-1 may be surrounded by P-type doped region 108-1 and formed above N-type well 102-1. P+ type doped region 110-1 may be coupled to node 64-1 held at voltage VA1. In order to optimize isolation, space consumption within substrate 120, and light collecting area, regions 108-1, 104-1, and 102-1 may be formed in concentric rings around region 110-1 at the front (top) surface of substrate 120. SPAD 60-1 may, for example, be formed from a portion of substrate 120 including region 110-1, region 108-1, and the portion of well 102-1 between regions 104-1 and 108-1.

Avalanche photodiode circuit 54-2 may include a well of N-type doped semiconductor 102-2 in substrate 120. N-type well 102-2 may be surrounded by P+ type doped region 100. N+ type doped region 104-2 and P-type doped region 108-2 may be formed within N-type well 102-2. N+ type doped region 104-2 may be coupled to one or more control inputs 62-2 held at voltage VC. P+ type doped region 110-2 may be surrounded by P-type doped region 108-2 and formed above N-type well 102-2. P+ type doped region 110-2 may be coupled to node 64-2 held at voltage VA2. In order to optimize isolation, space consumption within substrate 120, and light collecting area, regions 108-2, 104-2, and 102-2 may be formed in concentric rings around region 110-2 at the front (top) surface of substrate 120. SPAD 60-2 may, for example, be formed from a portion of substrate 120 including region 110-2, region 108-2, and the portion of well 102-2 between region 104-2 and 108-2. The example of FIG. 4 is merely illustrative and, if desired, other layouts may be used.

Figure 5:
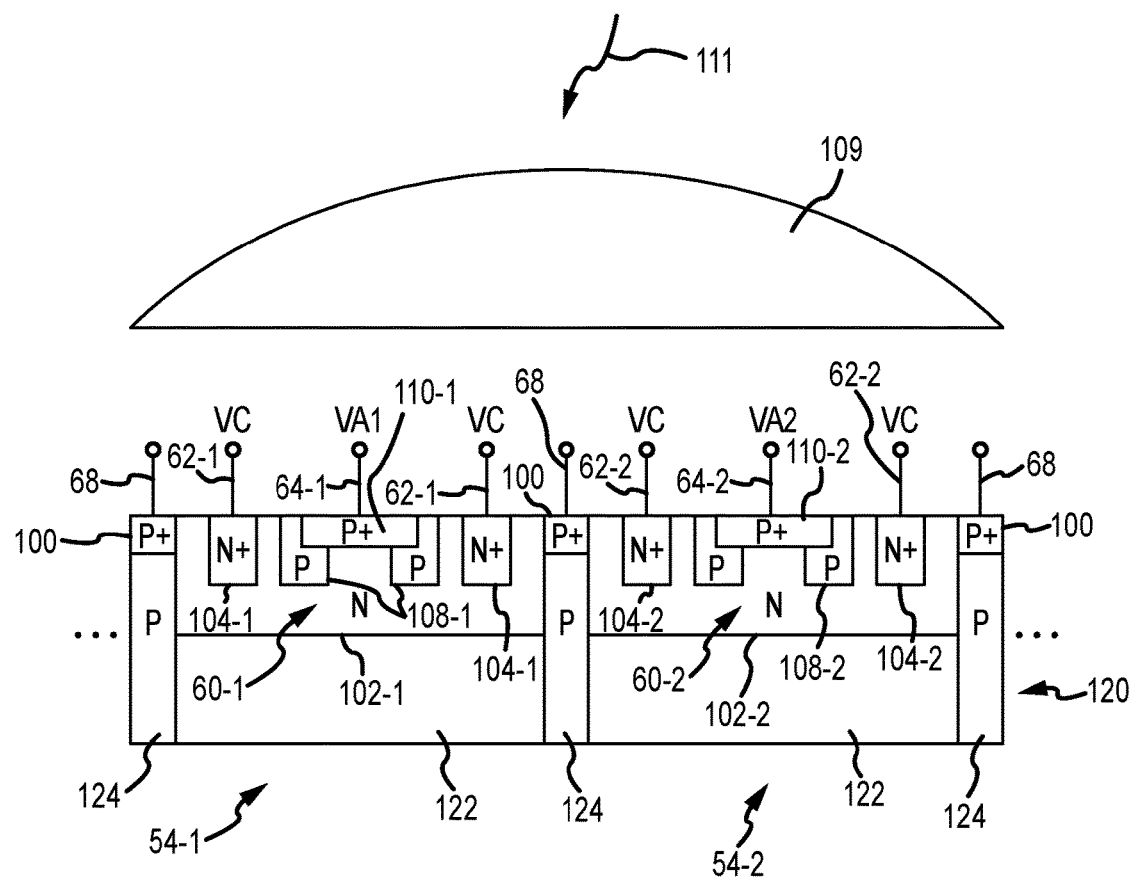
FIG. 5 is a cross-sectional side view of illustrative pixel circuitry of the type shown in FIG. 3 in accordance with an embodiment.

FIG. 5 is a cross-sectional side view of substrate 120 of FIG. 4. As shown in FIG. 5, N-type well 102-1 of photodiode circuit 54-1 and N-type well 104-2 of photodiode circuit 54-2 may be formed above semiconductor layer 122 of substrate 120. Photodiode circuit 54-1 may be isolated from photodiode circuit 54-2 and other adjacent circuitry by P-type interposers 124 if desired. N+ type doped region 104-1 and P-type doped region 108-1 may be formed in N-type well 102-1. N+ type doped region 104-2 and P-type doped region 108-2 may be formed in N-type well 102-2. P+ type doped region 110-1 may be formed at a surface of substrate 120 over N-type well 102-1 and surrounded by P-type doped layer 108-1. P+ type doped region 110-2 may be formed at a surface of substrate 120 over N-type well 102-2 and surrounded by P-type doped layer 108-2. Control inputs 108, 62, and 64 may be coupled to substrate 120 and may receive corresponding voltages. A microlens such as microlens 109 may be formed over substrate 120 and may direct image light 111 onto photodiodes 60-1 and 60-2. Avalanche photodiode circuits 54-1 and 54-2 may both generate a pulse high in signals VIN1 and VIN2, respectively, when a pulse in received light 111 is received (e.g., a pulse emitted by light source 28 and reflected off of the imaged scene).

The example of FIG. 5 is merely illustrative. In general, any desired microlens arrangement may be used. For example, each photodiode circuit 54 may include a corresponding microlens. Other layouts may be used if desired. In the example of FIG. 5, avalanche photodiode circuits 54-1 and 54-2 are arranged laterally with respect to each other on substrate 120. This is merely illustrative. If desired, photodiode circuits 54-1 and 54-2 may be vertically stacked.

Figure 6:
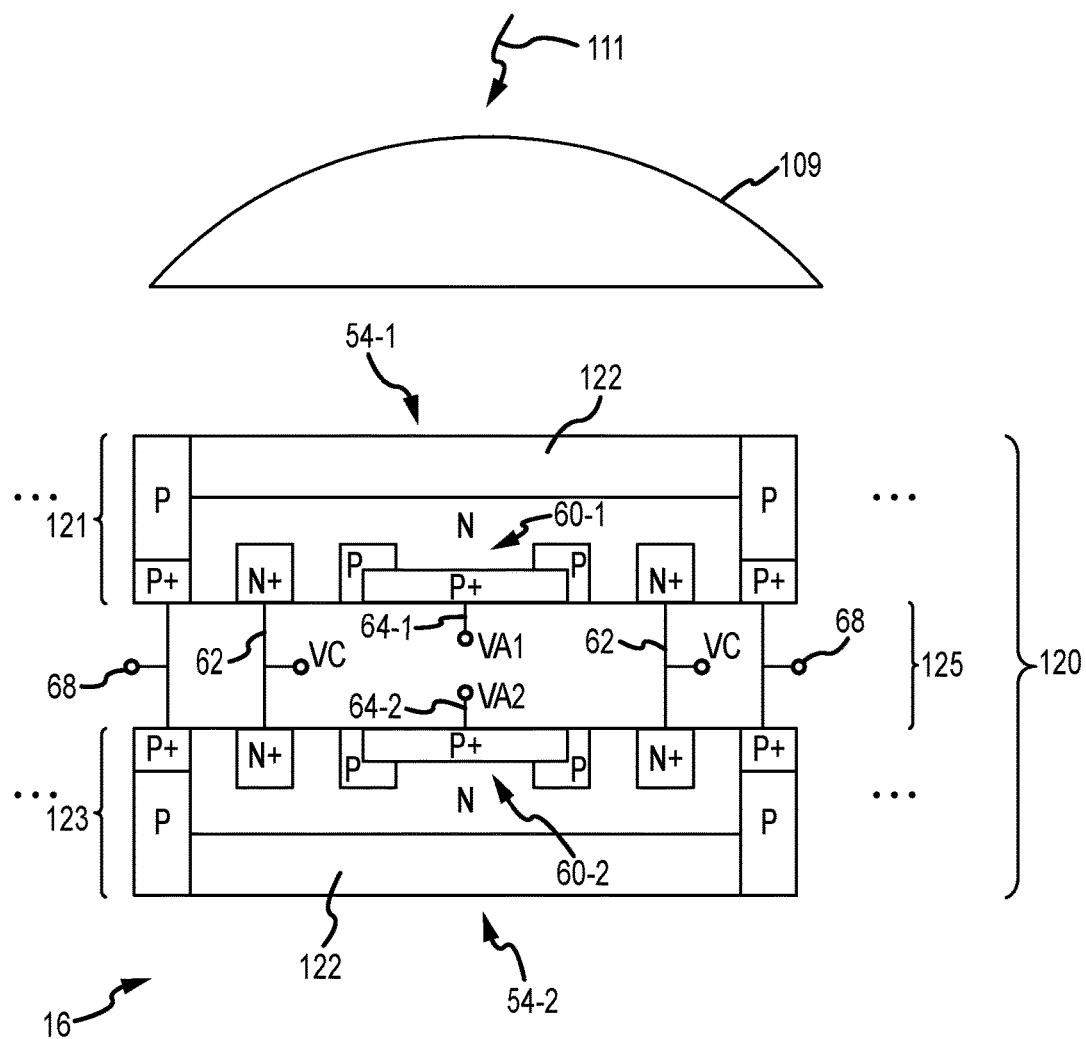
FIG. 6 is a cross-sectional side view of illustrative pixel circuitry of the type shown in FIG. 3 having a vertically stacked arrangement in accordance with an embodiment.

FIG. 6 is a cross-sectional side view of substrate 120 having vertically-stacked avalanche photodiode circuits. As shown in FIG. 6, avalanche photodiode circuit 54-2 may be formed from a first portion 123 of substrate 120. Avalanche photodiode circuit 54-1 may be flipped with respect to circuit 54-1 and formed in portion 121 of substrate 120. Control paths 68 and 62 may be shared between both circuits 54-2 and 54-1 if desired. Control paths 68 and 62 as well as circuit nodes 64-1 and 64-2 may be formed within routing layers 125 of substrate 120. Image light 111 may be conveyed through microlens 109 and may be received by photodiodes 60-1 and 60-2. The arrangement of FIG. 6 may occupy less lateral area in substrate 120 than in the arrangement of FIG. 5 but may also have reduced quantum efficiency relative to the arrangement of FIG. 5, for example. The example of FIG. 6 is merely illustrative. Any desired layout may be used if desired.

In various embodiments, an electronic device may include a pixel array. The pixel array may include a pixel with a first avalanche photodiode circuit that generates a first output signal on a first conductive line and a second avalanche photodiode circuit that generates a second output signal on a second conductive line. The pixel may include a logic NAND gate having a first input coupled to the first conductive line, a second input coupled to the second conductive line, and an output coupled to an output line. The logic NAND gate may generate a third output signal on the output line based on the first and second output signals.

The electronic device may include control circuitry. The control circuitry may generate range information based on the third output signal and a three-dimensional image based on the generated range information. A light source may emit a pulse of light, and the control circuitry may generate the range information based on a time delay between the emitted pulse of light and a pulse in the third output signal generated by the logic NAND gate. The pixel may include a third avalanche photodiode circuit that generates a fourth output signal on a third conductive line and a fourth avalanche photodiode circuit that generates a fifth output signal on a fourth conductive line. The logic NAND gate may have a third input coupled to the third conductive line and a fourth input coupled to the fourth conductive line. The logic NAND gate may generate the third output signal based on the first, second, fourth, and fifth output signals. A transistor may be coupled between the first avalanche photodiode circuit and the second avalanche photodiode circuit.

The first avalanche photodiode circuit may include a first P+ type doped semiconductor region surrounded by both a first P-type doped semiconductor region and a first N-type doped semiconductor region in a semiconductor substrate. The second avalanche photodiode circuit may include a second P+ type doped semiconductor region surrounded by both a second P-type doped semiconductor region and a second N-type doped semiconductor region in the semiconductor substrate. The first avalanche photodiode circuit may be vertically stacked with respect to the second avalanche photodiode circuit. A P-type implant region may be formed in the semiconductor substrate between the first N-type doped semiconductor region and the second N-type doped semiconductor region. The first avalanche photodiode circuit may include a first single photon avalanche photodiode (SPAD) that receives a bias voltage and the second avalanche photodiode circuit may include a second SPAD having a second cathode configured to receive the bias voltage. The first SPAD may have a first anode coupled to a first ground terminal through a first transistor having a first gate terminal. The first gate terminal may receive a control signal to adjust a reverse bias of the first SPAD. The second SPAD may have a second anode coupled to a second ground terminal through a second transistor having a second gate terminal. The second gate terminal may be configured to receive the control signal to adjust a reverse bias of the second SPAD. A microlens may convey image light to both the first and second avalanche photodiode circuits.

In various embodiments, an image sensor pixel array may be formed on a semiconductor substrate and may include a first avalanche photodiode, a second avalanche photodiode, a first output path coupled to an anode of the first avalanche photodiode through a first source follower, a second output path coupled to an anode of the second avalanche photodiode through a second source follower, and logic circuitry having a first input that receives a first signal associated with the first avalanche photodiode over the first output path and a second input that receives a second signal associated with the second avalanche photodiode over the second output path. The logic circuitry may generate an output signal based on the first and second signals that is independent of dark current generated by the first and second avalanche photodiodes.

The logic circuitry may include a logic NAND gate that generates the output signal by performing a logic NAND operation on at least the first and second signals. A transistor may be coupled between the anode of the first avalanche photodiode and the anode of the second avalanche photodiode. The array may include a third avalanche photodiode, a fourth avalanche photodiode, a third output path coupled to an anode of the third avalanche photodiode through a third source follower, and a fourth output path coupled to an anode of the fourth avalanche photodiode through a fourth source follower. The logic NAND gate may have the first and second inputs and may include a third input that receives a third signal associated with the third avalanche photodiode over the third output path and a fourth input that receives a fourth signal associated with the fourth avalanche photodiode over the fourth output path. The logic NAND gate may generate the output signal by performing the logic NAND operation on at least the first, second, third, and fourth signals. The first and second avalanche photodiodes may be arranged in respective first and second rows of a first column and the third and fourth avalanche photodiodes are arranged in respectively in the first and second rows of a second column. The logic circuitry may include majority vote logic circuitry. The first and second inputs of the logic circuitry may include two of many inputs of the majority vote logic circuitry. The majority vote logic circuitry may change a logic value of the output signal in response to determining that at least a majority of its inputs are receiving signals at a logic high level.

In various embodiments, an integrated circuit may include a first Geiger-mode avalanche photodiode, a second Geiger-mode avalanche photodiode, and a logic NAND gate having a first input that is coupled to the first Geiger-mode avalanche photodiode through a first source follower transistor and a second input that is coupled to the second Geiger-mode avalanche photodiode through a second source follower transistor. The logic NAND gate may generate an output signal by performing a logic NAND operation on a first signal conveyed from the first Geiger-mode avalanche photodiode to the first input by the first source follower transistor and a second signal conveyed from the second Geiger-mode avalanche photodiode to the second input by the second source follower transistor. The integrated circuit may include third Geiger-mode avalanche photodiode. The logic NAND gate may have a third input that is coupled to the third Geiger-mode avalanche photodiode through a third source follower transistor. The logic NAND gate may generate the output signal by performing the logic NAND operation on the first signal, the second signal, and a third signal conveyed from the third Geiger-mode avalanche photodiode to the third input by the third source follower transistor.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device having a pixel array, wherein the pixel array comprises:
    a first avalanche photodiode circuit configured to generate a first output signal on a first conductive line;
    a second avalanche photodiode circuit configured to generate a second output signal on a second conductive line, wherein the first avalanche photodiode circuit is vertically stacked with respect to the second avalanche photodiode circuit; and
    a logic NAND gate having a first input coupled to the first conductive line, a second input coupled to the second conductive line, and an output coupled to an output line, wherein the logic NAND gate is configured to generate a third output signal on the output line based on the first and second output signals.

2. The electronic device defined in claim 1, further comprising:
control circuitry, wherein the control circuitry is configured to generate range information based on the third output signal.

3. The electronic device defined in claim 2, wherein the control circuitry is configured to generate a three-dimensional image based on the generated range information.

4. The electronic device defined in claim 3, further comprising:
a light source configured to emit a pulse of light, wherein the control circuitry is configured to generate the range information based on a time delay between the emitted pulse of light and a pulse in the third output signal generated by the logic NAND gate.

5. The electronic device defined in claim 1, further comprising:
a third avalanche photodiode circuit configured to generate a fourth output signal on a third conductive line; and
a fourth avalanche photodiode circuit configured to generate a fifth output signal on a fourth conductive line, wherein the logic NAND gate has a third input coupled to the third conductive line and a fourth input coupled to the fourth conductive line, and wherein the logic NAND gate is configured to generate the third output signal based on the first, second, fourth, and fifth output signals.

6. The electronic device defined in claim 1, further comprising a transistor coupled between the first avalanche photodiode circuit and the second avalanche photodiode circuit.

7. The electronic device defined in claim 1, wherein the first avalanche photodiode circuit comprises a first P+ type doped semiconductor region surrounded by both a first P-type doped semiconductor region and a first N-type doped semiconductor region in a semiconductor substrate and wherein the second avalanche photodiode circuit comprises a second P+ type doped semiconductor region surrounded by both a second P-type doped semiconductor region and a second N-type doped semiconductor region in the semiconductor substrate.

8. The electronic device defined in claim 1, wherein the first avalanche photodiode circuit comprises a first single photon avalanche photodiode (SPAD) configured to receive a bias voltage and wherein the second avalanche photodiode circuit comprises a second SPAD having a second cathode configured to receive the bias voltage.

9. The electronic device defined in claim 8, wherein the first SPAD has a first anode coupled to a first ground terminal through a first transistor having a first gate terminal, wherein the first gate terminal is configured to receive a control signal to adjust a reverse bias of the first SPAD, wherein the second SPAD has a second anode coupled to a second ground terminal through a second transistor having a second gate terminal, and wherein the second gate terminal is configured to receive the control signal to adjust a reverse bias of the second SPAD.

10. The electronic device defined in claim 1, further comprising:
a microlens that is configured to convey image light to both the first and second avalanche photodiode circuits.

11. An image sensor pixel array formed on a semiconductor substrate, comprising:
a first avalanche photodiode;
a second avalanche photodiode;
a third avalanche photodiode;
a fourth avalanche photodiode, wherein the first and second avalanche photodiodes are arranged in respective first and second rows of a first column and the third and fourth avalanche photodiodes are arranged in respectively in the first and second rows of a second column;
a first output path coupled to an anode of the first avalanche photodiode through a first source follower;
a second output path coupled to an anode of the second avalanche photodiode through a second source follower;
a third output path coupled to an anode of the third avalanche photodiode through a third source follower;
a fourth output path coupled to an anode of the fourth avalanche photodiode through a fourth source follower; and
logic circuitry having a first input that receives a first signal associated with the first avalanche photodiode over the first output path, a second input that receives a second signal associated with the second avalanche photodiode over the second output path, a third input that receives a third signal associated with the third avalanche photodiode over the third output path, and a fourth input that receives a fourth signal associated with the fourth avalanche photodiode over the fourth output path, wherein the logic circuitry is configured to generate an output signal based on the first, second, third, and fourth signals that is independent of dark current generated by the first, second, third, and fourth avalanche photodiodes.

12. The electronic device defined in claim 1, further comprising:
a microlens, wherein the second avalanche photodiode circuit is interposed between the microlens and the first avalanche photodiode circuit.

13. The image sensor pixel array defined in claim 11, wherein the logic circuitry comprises majority vote logic circuitry, wherein the first and second inputs of the logic circuitry comprise two of a plurality of inputs of the majority vote logic circuitry, and wherein the majority vote logic circuitry is configured to change a logic value of the output signal in response to determining that at least a majority of the plurality of inputs are receiving signals at a logic high level.

14. The image sensor pixel array defined in claim 11, wherein the logic circuitry comprises a logic NAND gate configured to generate the output signal by performing a logic NAND operation on at least the first and second signals.

15. The image sensor pixel array defined in claim 14, further comprising:
a transistor coupled between the anode of the first avalanche photodiode and the anode of the second avalanche photodiode.

16. The image sensor pixel array defined in claim 14, wherein the logic NAND gate is configured to generate the output signal by performing the logic NAND operation on at least the first, second, third, and fourth signals.

17. An integrated circuit, comprising:
a first Geiger-mode avalanche photodiode;
a second Geiger-mode avalanche photodiode;
a transistor coupled between the first Geiger-mode avalanche photodiode and the second Geiger-mode avalanche photodiode; and a logic NAND gate having a first input that is coupled to the first Geiger-mode avalanche photodiode through a first source follower transistor and a second input that is coupled to the second Geiger-mode avalanche photodiode through a second source follower transistor, wherein the logic NAND gate is configured to generate an output signal by performing a logic NAND operation on a first signal conveyed from the first Geiger-mode avalanche photodiode to the first input by the first source follower transistor and a second signal conveyed from the second Geiger-mode avalanche photodiode to the second input by the second source follower transistor.

18. The integrated circuit defined in claim 17, further comprising:

a third Geiger-mode avalanche photodiode, wherein the logic NAND gate has a third input that is coupled to the third Geiger-mode avalanche photodiode through a third source follower transistor, and wherein the logic NAND gate is configured to generate the output signal by performing the logic NAND operation on the first signal, the second signal, and a third signal conveyed from the third Geiger-mode avalanche photodiode to the third input by the third source follower transistor.

* * * * *